United States Patent [19]

Wilhelm

[11] 4,110,694
[45] Aug. 29, 1978

[54] CHANNEL NUMBER INTERFACE

[75] Inventor: Gary L. Wilhelm, Waseca, Minn.

[73] Assignee: Warren A. Sturm, Minneapolis, Minn.

[21] Appl. No.: 621,364

[22] Filed: Oct. 10, 1975

[51] Int. Cl.² .......................... H04B 1/06; H03B 3/04
[52] U.S. Cl. .................................... 325/464; 331/1 A
[58] Field of Search ............ 325/17, 25, 184, 419–422, 325/455, 464; 331/1 A, 37, 41, 16, 25, 17, 18, 30

[56] References Cited

U.S. PATENT DOCUMENTS

| | | | |
|---|---|---|---|
| 3,588,730 | 6/1971 | Schreuer et al. | 331/41 |
| 3,588,732 | 6/1971 | Tollefson | 331/16 |
| 3,845,394 | 10/1974 | Hamada | 325/455 |
| 3,864,637 | 2/1975 | Kanow | 325/421 |
| 3,898,579 | 8/1975 | Aldridge | 331/16 |
| 3,902,132 | 8/1975 | Fried | 331/25 |
| 3,909,723 | 9/1975 | Manson et al. | 325/421 |
| 3,921,094 | 11/1975 | Schaible | 331/1 A |
| 3,949,305 | 4/1976 | McClaskey et al. | 325/421 |
| 3,959,737 | 5/1976 | Tanis | 331/1 A |
| 3,988,696 | 10/1976 | Sharpe | 331/1 A |
| 4,013,957 | 3/1977 | Tojo | 325/455 X |

Primary Examiner—Robert L. Griffin
Assistant Examiner—Aristotelis M. Psitos
Attorney, Agent, or Firm—Warren A. Sturm; Hugh D. Jaeger

[57] ABSTRACT

A digital frequency synthesizer in which a BCD ÷ N counter is used to provide the desired frequencies of operation without requiring further BCD decoding operations to provide direct channel number interface. This is accomplished by selecting a value of (N) corresponding to a desired channel number (CN) and selecting a downmix heterodyning frequency so that the lower order bits of (N) are equal to the desired (CN) without need for further conversation.

3 Claims, 4 Drawing Figures

CHANNEL NUMBER INTERFACE

BACKGROUND OF THE INVENTION

1. Field of the Invention

My invention relates to the general art of generating a signal or signals for controlling the frequency of operation of a transmitter and/or receiver in communications systems.

2. Description of the Prior Art

In the art for which my invention has been developed, the use of digital synthesizers to provide frequency references in communications equipment has involved programming and display which expressed operations in terms of frequency. However, in the ever expanding citizens band applications, the channels available are expressed in channel numbers relating to predetermined frequencies. Further, such prior art devices where they have attempted to accomplish this conversion from channel number to frequency, have required the use of expensive and complicated code conversion techniques which have proved satisfactory to accomplish the ends but because of the manufacturing complications and expense, have proven generally unsuitable.

SUMMARY OF THE INVENTION

In implementing the principles of my invention, a frequency synthesizer having channel number inputs and outputs may be fabricated from readily available components. My invention includes a phase-locked loop having an output from a voltage controlled oscillator and inputs to a phase detector, one of the inputs comprising a selected reference frequency and the other input comprising a heterodyned output from the voltage controlled oscillator divided by the number N, interfaced to a channel number selector and display without requiring the use of any code converters, adders or the like. The frequency for the heterodyning downmixer is chosen so that the lower order bits of the ÷N numbers equal the channel number in binary coded decimal. This method of interface, which avoids any code conversion when the channels are consecutive and equally spaced, and which may be used to minimize code conversion circuitry when they are not consecutive and equally spaced, achieves a great simplicity.

DETAILED DESCRIPTION OF THE DRAWINGS

Table of Definitions

Figure 1:
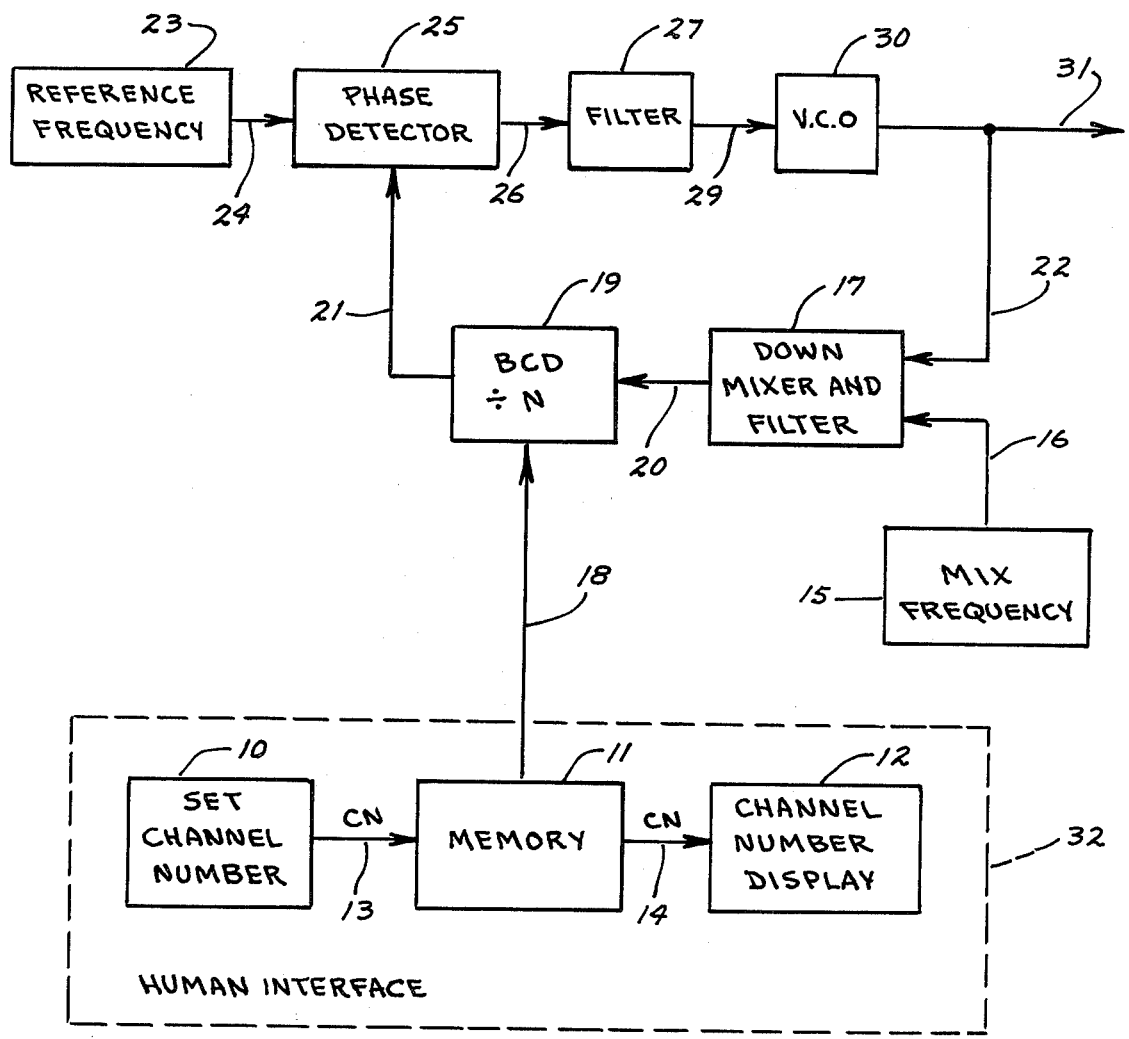
FIG. 1 is a block diagrammatic representation of the general form of my invention illustrating its basic operation.

V.C.O = Voltage Controlled Oscillator
B.C.D. = Binary Coded Decimal
C.N. = Channel Number
N = Programmable Divide Number Referring now to FIG. 1 of the drawings, it will be seen that a binary coded decimal encoder 32 under the control and observation of an operator, includes a set channel number input device 10 which converts a channel number to a BCD signal which is then stored in a memory 11 that is connected to said channel number device 10 through conductors 13. One output of the memory is connected to a channel number display device 12 through conductors 14. A suitable channel number display device 12 will contain appropriate circuitry (not shown) for displaying the channel number selected.

At the top of the drawing, an output conductor 31 is shown connected to the output of a voltage controlled oscillator 30 which is in turn connected to the output of a phase detector 25 through conductor 29, filter 27 and conductor 26. One input of phase detector 25 is connected to a reference frequency source 23 through a conductor 24 and the other input is connected to conductor 31 through conductor 22, downmixer 17, conductor 20, a programmable BCD divider 19 and conductor 21. A programmable BCD divider 19 is also connected to the output of memory 11 through conductors 18. Downmixer and filter 17 is shown connected to a source of mixing frequency 15 through conductor 16.

In operation, the apparatus shown will have a frequency output equal to the downmixing frequency plus or minus N times the reference frequency. The mix frequency is chosen so that the output of downmixer 17 will be equal to N times the reference frequency and dividing this in BCD divider 19 by N will provide a signal substantially that of the reference frequency at the second input terminal of phase detector 25.

The following is a table indicating one specific mode of operation wherein "N" is selected to lie within the range from 81 to 120 expressed in decimal terms and binary coded decimal terms as well as channel numbers and channel numbers lie with the range 1 to 40:

| N in Decimal | N in BCD | | CN in Decimal | CN in BCD | |
|---|---|---|---|---|---|
| 81 | 1000 | 0001 | 1 | 000 | 0001 |
| 82 | . | 0010 | 2 | . | . |
| 83 | . | 0011 | 3 | . | . |
| 84 | . | 0100 | 4 | . | . |
| 85 | . | 0101 | 5 | . | . |
| 86 | . | 0110 | 6 | . | . |
| 87 | . | 0111 | 7 | . | . |
| 88 | . | 1000 | 8 | . | . |
| 89 | 1000 | 1001 | 9 | 000 | 1001 |
| . | 1001 | 0000 | 10 | 001 | 0000 |
| . | . | 0001 | 11 | . | . |
| . | . | 0010 | 12 | . | . |
| . | . | 0011 | 13 | . | . |
| . | . | . | . | . | . |
| 120 | 1100 | 0000 | 40 | 100 | 0000 |

It will be seen then that since the lower order binary coded decimal bits of N = the BCD bits of CN, no interface circuitry is needed.

Figure 2:
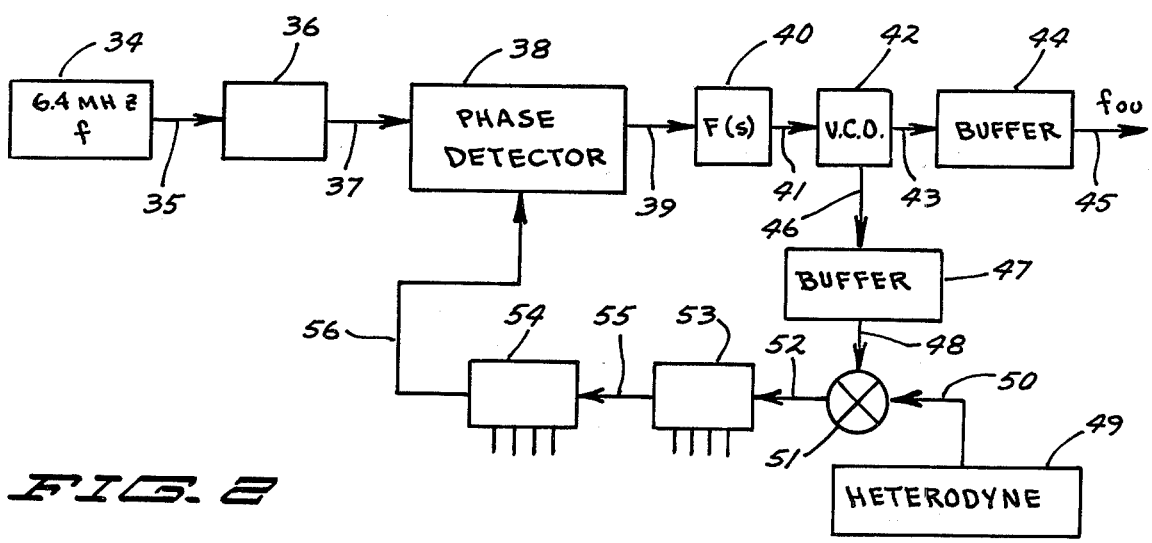
FIG. 2 is an application of the principles of my invention to a specific situation.

Referring now to FIG. 2 of the drawings, the specific embodiment of my invention is illustrated in a synthesizer for a 40 channel Class E citizens band device. Again, an output conductor 45 is adapted to be connected to suitable receiving or transmitting equipment for utilization in controlling the operation thereof. Conductor 45 is connected through a buffer 44 to voltage controlled oscillator 42 through conductor 43. Voltage controlled oscillator is connected to a phase detector 38 through conductor 41, filter 40 and conductor 39. One of the input terminals of phase detector 38 is connected to a source of reference frequency 34 through conductor 37, buffer 36 and conductor 35. The other input terminal of phase detector 38 is connected to an output of voltage controlled oscillator 42 through conductor 46, buffer 47, conductor 48, mixer 51, conductor 52, divider 53, conductor 55, divider 54 and conductor 56. A source of heterodyne reference frequency 49 is also connected to mixer 51 through conductor 50.

Figure 3:
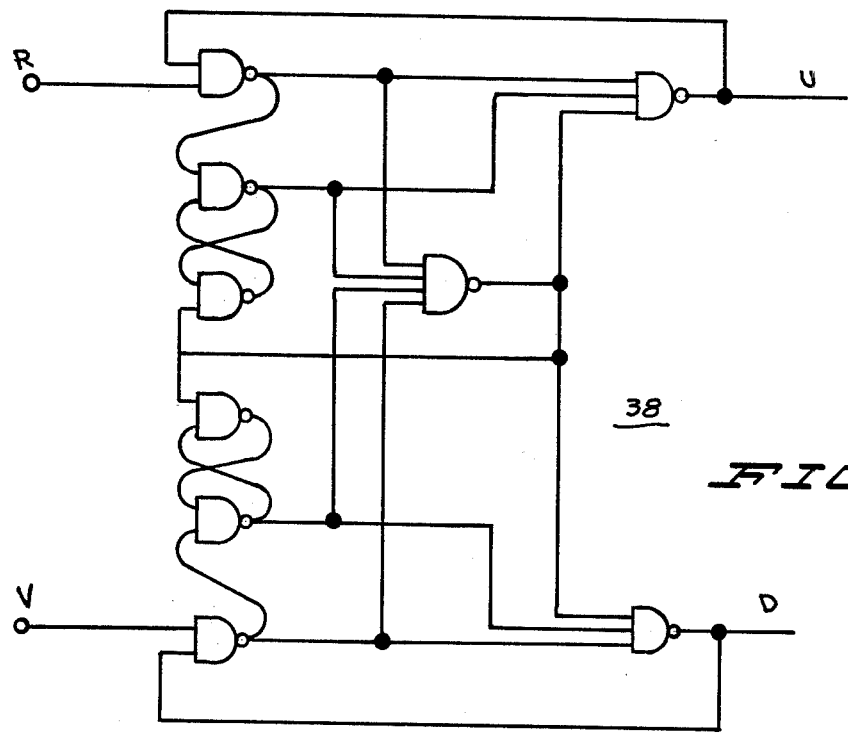
FIG. 3 is an enlarged schematic representation of a phase detector usable in the apparatus of FIG. 2.

In this specific embodiment, decimal N numbers 81 through 120 have been used to express corresponding Class E channels 1 to 40, as illustrated above. Channel No. 1 for a Class E receive operation may be 213.3125 megahertz. The reference frequency of this embodiment is shown to be 6.4 MHZ and the downmix heterodyning frequency providing the operation in accordance with the principles of my invention is 105.64375 MHZ. The various components, where not readily determinable by one skilled in the art, such as a voltage control oscillator filters and buffers and mixers and oscillators, may be comprised of this embodiment as follows:

| Reference Character | Apparatus |
| --- | --- |
| 53 | Type 14522 cmos divider |
| 54 | Type 14526 cmos divider | and, as illustrated in detail in FIG. 3, phase detector 38 may be comprised of Type MC 14011, Type MC 14012 and Type MC 14023 cmos devices.

As seen in FIG. 3, phase detector 38 has a pair of input terminals R and V, and a pair of output terminals U and D representing voltage command signals to be applied to voltage controlled oscillator 42 in accordance with the comparison made between reference source 34 and the signal applied to the other input terminal on phase detector 38.

Figure 4:
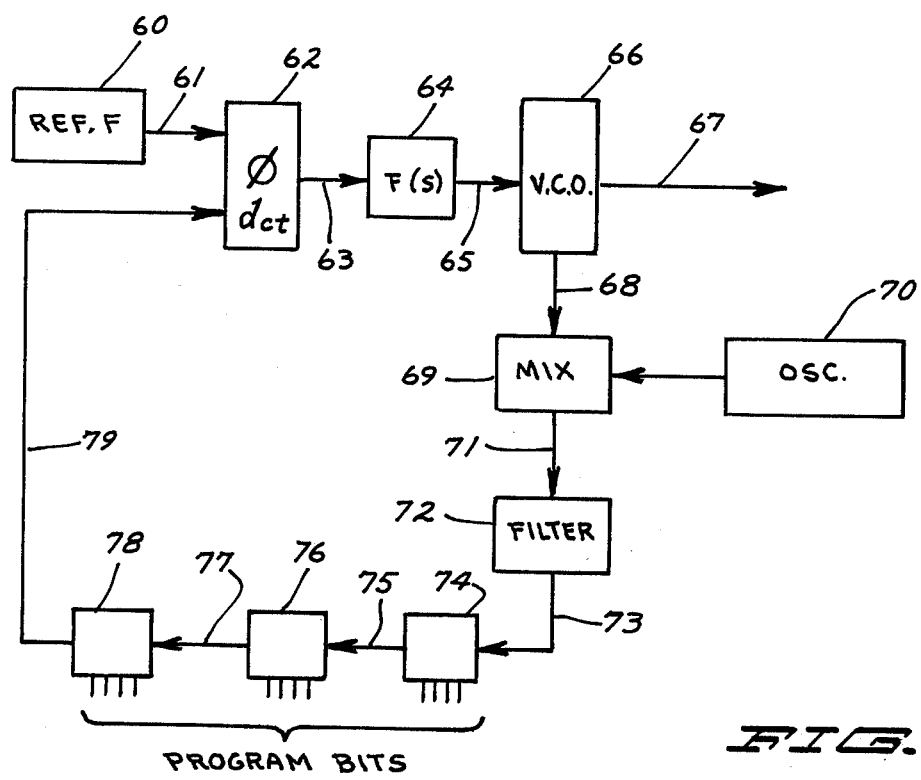
FIG. 4 is a block diagrammatic drawing illustrating still another application of my invention.

Referring to FIG. 4 of the drawings, a further embodiment of my invention employs TTL or other circuit technology components for performing part of the functions of the apparatus. FIG. 4 includes an output conductor 67 connected to the output of voltage controlled oscillator 66. Voltage controlled oscillator 66 is connected to a phase detector 62 through conductors 65, filter 64 and conductor 63. One input terminal of phase detector 62 is connected to a reference frequency source 60 through conductor 61. The other input terminal on phase detector 62 is connected to the output of voltage control oscillator 66 through conductor 68, mixer 69, conductor 71, filter 72, conductor 73, divider 74, conductor 75, divider 76, conductor 77, divider 78 and conductor 79.

Dividers 74 and 76 may be comprised of type 4016 TTL devices and divider 78 may be comprised of either of a 4016 or 4018 TTL device.

By selection of the heterodyne frequency for mixer 69 so that the lower order program bits are equal to the channel number expressed in binary coded decimal, the BCD switches and channel number displays can be connected directly to the program bit lines without need for any code conversion circuitry.

Having now therefore fully illustrated and described my invention, what I claim to be new and desire to protect by Letters Patent is:

1. Digital synthesizer for providing a frequency reference in communications apparatus of the class wherein the nominal frequency of operation is expressed in terms of numbers for the synthesized frequencies of operation comprising:
   a. a source of reference frequency;
   b. phase detecting means connected to said source of reference frequency;
   c. means including a filter and a voltage controlled oscillator connecting an output of said phase detecting means to an output terminal;
   d. a down mixer and filter means connected to said output terminal;
   e. a mix frequency source means connected to said down mixer;
   f. a binary coded decimal divide by N divider means connected between said down mixer and filter means and said phase detecting means;
   g. a memory means connected to said BCD divide by N divider means, and;
   h. a source of number input means connected to an input of said BCD divide by N means whereby such particular numbered input of said numbered input means corresponds to a particular channel related frequency number, and the down mixer and filter means in addition to said source of mix frequency permits the choice of N for said BCD divide by N divider means so that the lower order bits of said BCD divide by N divider means are equal to said channel numbers.

2. Digital synthesizer for providing a frequency reference in communications apparatus of the class wherein the nominal frequency of operation is expressed in terms of numbers related to synthesized frequencies comprising:
   a. a source of reference frequency;
   b. phase detecting means connected to said source of reference frequency;
   c. means including a filter and a voltage controlled oscillator connecting an output of said phase detecting means to an output terminal;
   d. a binary coded decimal (BCD) divide by N divider means connected between said output terminal and an input of said phase detecting means where number inputs to said BCD divider correspond to frequency related numbers;
   e. a source of channel number input means connected to an input of said BCD divide by N means where each number input of said number input means corresponds to a particular frequency related number;
   f. a down mixer and filter means connected from said output terminal to said BCD divide by N divider means; and,
   g. a mix frequency source means connected to said down mixer and filter means whereby the utilization of said down mixer and filter means and said source of mix frequency permits the choice of N for said BCD divide by N divider means so that the lower order bits of said BCD divide by N divider means numbers are equal to said channel numbers.

3. Method of digital synthesization for providing a frequency reference in communications apparatus of the class wherein the nominal frequency of operation is expressed in terms of numbers related to synthesized frequencies comprising the steps of:
   a. generating a source of reference frequency;
   b. detecting the phase of said source of reference frequency;
   c. filtering said reference frequency and using a voltage controlled oscillator (VCO) in a phase locked loop;

d. dividing an output of said VCO with a binary coded decimal (BCD) divide by N divider connected in said phase locked loop;
e. generating a channel number input to said BCD divide by N divider corresponding to a frequency related channel;
f. generating a source of mix frequency; and,
g. down mixing and filtering the source of mix frequency and the output from said voltage controlled oscillator and feeding the down mixed product frequency to said BCD divide by N divider whereby utilization of said down mixer and filter means and said source of mix frequency permits the choice of N for said BCD divide by N divider so that the lower order bits of BCD divide by N numbers are equal to said channel numbers.

* * * * *